United States Patent
Sandstrom

(10) Patent No.: US 7,365,901 B2
(45) Date of Patent: Apr. 29, 2008

(54) PATTERN GENERATOR

(75) Inventor: Torbjorn Sandstrom, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 11/314,413

(22) Filed: Dec. 22, 2005

(65) Prior Publication Data

US 2006/0103914 A1 May 18, 2006

Related U.S. Application Data

(63) Continuation of application No. 10/776,192, filed on Feb. 12, 2004, now Pat. No. 7,009,753, which is a continuation of application No. 09/623,195, filed on Aug. 29, 2000, now Pat. No. 6,747,783.

(51) Int. Cl.
G02B 26/08 (2006.01)
G02B 26/00 (2006.01)
G03C 5/00 (2006.01)

(52) U.S. Cl. ........................ 359/298; 359/290; 430/311
(58) Field of Classification Search ................ 359/223, 359/290, 291, 295, 298; 430/311
See application file for complete search history.

(56) References Cited

U.S. PATENT DOCUMENTS

| | | |
|---|---|---|
| 4,566,935 A | 1/1986 | Hornbeck |
| 5,073,010 A | 12/1991 | Johnson et al. |
| 5,148,157 A | 9/1992 | Florence |
| 5,171,965 A | 12/1992 | Suzuki et al. |
| 5,296,891 A | 3/1994 | Vogt et al. |
| 5,497,258 A | 3/1996 | Ju et al. |
| 5,504,504 A | 4/1996 | Markandey et al. |
| 5,508,841 A | 4/1996 | Lin et al. |
| 5,523,193 A | 6/1996 | Nelson |
| 5,539,567 A | 7/1996 | Lin et al. |
| 5,539,568 A | 7/1996 | Lin et al. |

(Continued)

FOREIGN PATENT DOCUMENTS

| | | |
|---|---|---|
| EP | 0467076 A2 | 1/1992 |
| WO | WO 9309469 A1 | 5/1993 |
| WO | WO 9804950 | 2/1998 |

(Continued)

OTHER PUBLICATIONS

H. Kuck et al., New System for fast submicron laser direct writing, SPIE vol. 2440, pp. 506-514.
P.M. Hagelin et al., Micromachining and microfabrication technology for adaptive optics, os Sep. 16, 1999.

Primary Examiner—William C Choi
(74) Attorney, Agent, or Firm—Harness, Dickey & Pierce, P.L.C.

(57) ABSTRACT

The present invention relates to an apparatus for creating a pattern on a workpiece sensitive to radiation, such as a photomask a display panel or a microoptical device. The apparatus may include a source for emitting light flashes, a spatial modulator having modulating elements (pixels), adapted to being illuminated by the radiation, and a projection system creating an image of the modulator on the workpiece. It may further include an electronic data processing and delivery system receiving a digital description of the pattern to be written, converting the pattern to modulator signals, and feeding the signals to the modulator. An electronic control system may be provided to control a trigger signal to compensate for flash-to-flash time jitter in the light source.

7 Claims, 8 Drawing Sheets

U.S. PATENT DOCUMENTS

| | | |
|---|---|---|
| 5,835,256 A | 11/1998 | Huibers |
| 5,929,977 A | 7/1999 | Ozawa |
| 6,060,224 A | 5/2000 | Sweatt et al. |
| 6,268,906 B1 | 7/2001 | Suzuki |
| 6,285,488 B1 | 9/2001 | Sandstrom |
| 6,312,134 B1 * | 11/2001 | Jain et al. .................. 359/855 |
| 6,373,619 B1 | 4/2002 | Sandstrom |
| 6,428,940 B1 | 8/2002 | Sandstrom |
| 6,489,984 B1 | 12/2002 | Johnson |
| 6,504,644 B1 | 1/2003 | Sandstrom |
| 7,009,753 B2 * | 3/2006 | Sandstrom .................. 359/291 |

FOREIGN PATENT DOCUMENTS

| | | |
|---|---|---|
| WO | WO 9922262 | 5/1999 |
| WO | WO 9945439 | 9/1999 |
| WO | WO 9945441 | 9/1999 |
| WO | WO 0042618 | 7/2000 |

* cited by examiner

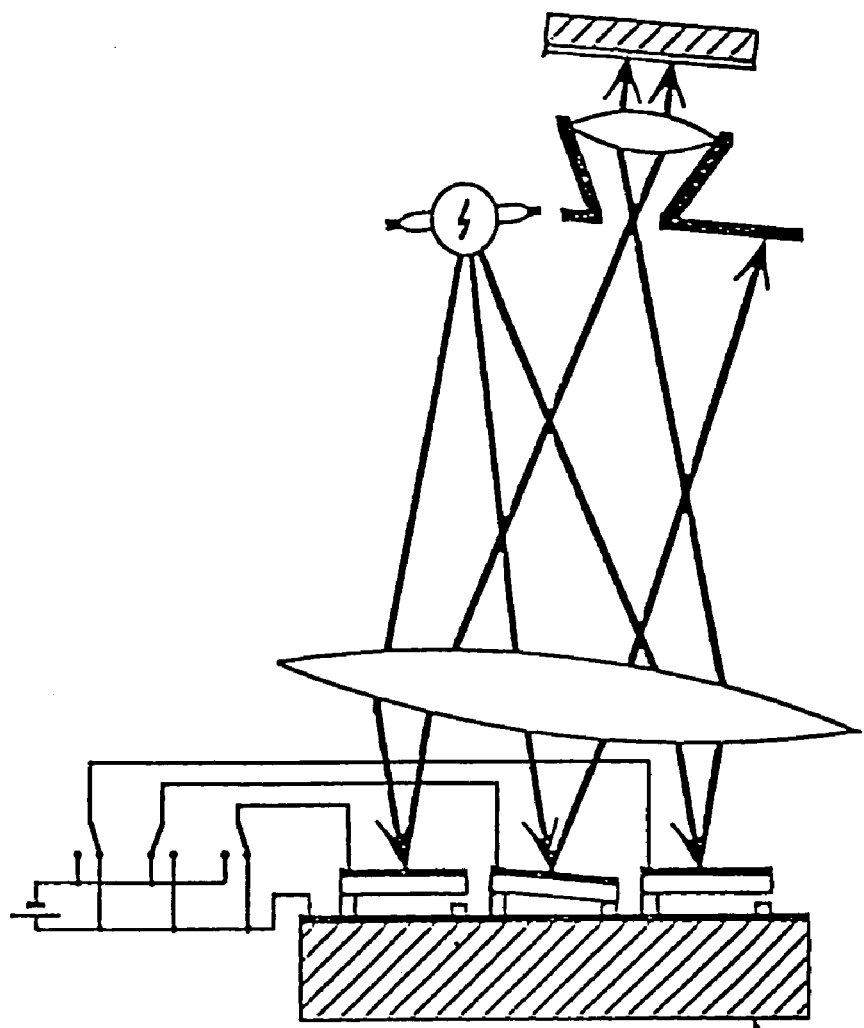
PRIOR ART
Figure 1
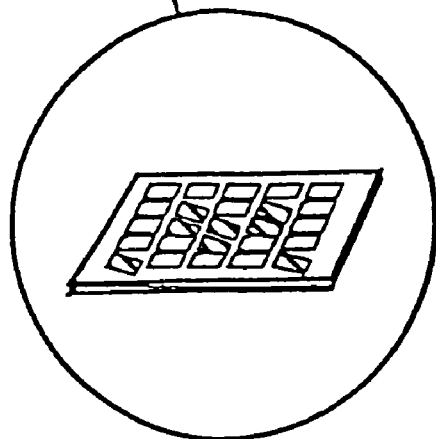

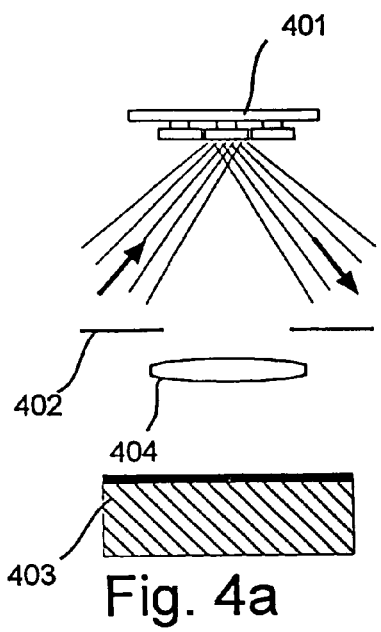
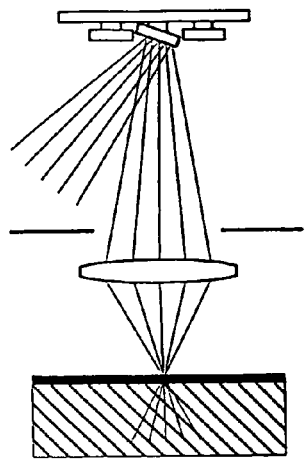
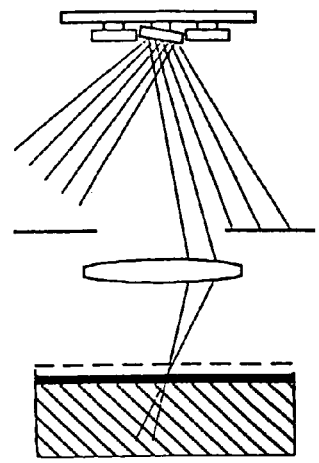
Fig. 4a    Fig. 4b    Fig. 4c
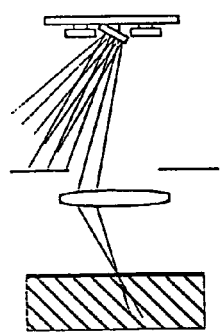 + 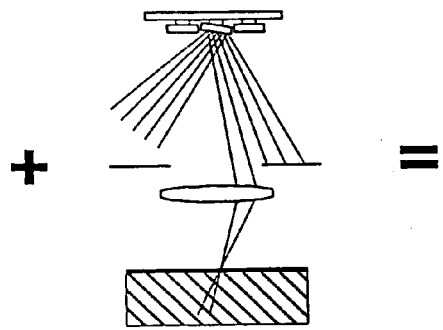 = 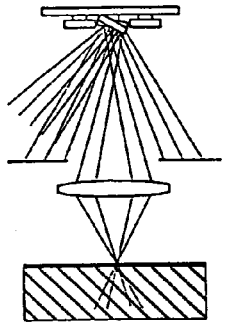
Fig. 4d    Fig. 4e    Fig. 4f
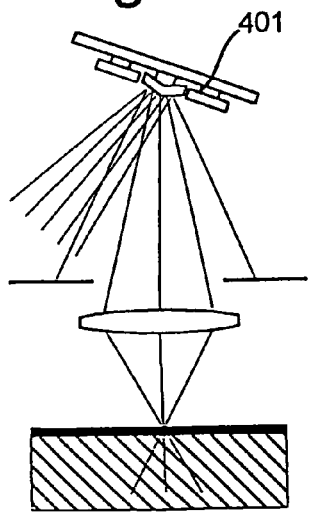
Fig. 4g
Fig. 4

PATTERN GENERATOR

CROSS-REFERENCE TO RELATED APPLICATIONS

This application is a continuation of application Ser. No. 10/776,192, filed on Feb. 12, 2004, now U.S. Pat. No. 7,009,753 which is a continuation of application Ser. No. 09/623,195, filed on Aug. 29, 2000; now U.S. Pat. No. 6,747,783 the entire contents of both of which are incorporated herein by reference.

FIELD OF THE INVENTION

The present invention relates to printing of patterns with extremely high precision on photosensitive surfaces, such as photomasks for semiconductor devices and displays. It also relates to direct writing of semiconductor device patterns, display panels, integrated optical devices and electronic interconnect structures. Furthermore, it can have applications to other types of precision printing such as security printing. The term printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared (IR) to extreme UV. Of special importance is the ultraviolet range from 370 nm (UV) through deep ultraviolet (DUV), vacuum ultraviolet (VUV) and extreme ultraviolet (EUV) down to a few nanometers wavelength. EUV is in this application defined as the range from 100 nm and down as far as the radiation is possible to treat as light. A typical wavelength for EUV is 13 nm. IR is defined as 780 nm up to about 20 □m.

In a different sense the invention relates to the art and science of spatial light modulators and projection displays and printers using such modulators. In particular it improves the grey-scale properties, the image stability through focus and image uniformity and the data processing for such modulators by application of analog modulation technique. The most important use of the analog modulation is to generate an image in a high-contrast material such as photoresist with an address grid, i.e. the increment by which the position of an edge in the pattern is specified, that is much finer than the grid created by the pixels of the spatial light modulator.

BACKGROUND OF THE INVENTION

It is known in the current art to build precision pattern generators using projection of micromirror spatial light modulators (SLMs) of the micromirror type (Nelson 1988, Kück 1990). To use an SLM in a pattern generator has a number of advantages compared to the more wide-spread method of using scanning laser spots: the SLM is a massively parallel device and the number of pixels that can be written per second is extremely high. The optical system is also simpler in the sense that the illumination of the SLM is non-critical, while in a laser scanner the entire beam path has to be built with high precision. Compared to some types of scanners, in particular electrooptic and acoustooptic ones, the micromirror SLM can be used at shorter wavelengths since it is a purely reflective device.

In both references cited above the spatial modulator uses only on-off modulation at each pixel. The input data is converted to a pixel map with one bit depth, i.e. with the values 0 and 1 in each pixel. The conversion can be done effectively using graphic processors or custom logic with area fill instructions.

In a previous application by the same inventor Sandström (Sandström et. al. 1990), the ability to use an intermediate exposure value at the boundary of a pattern element to fine-adjust the position of the element's edge in the image created by a laser scanner was described.

It is also known in the art to create a grey-scale image, preferably for projection display of video images and for printing, with an SLM by variation of the time a pixel is turned on or by printing the same pixel several times with the pixel turned on a varying number of times.

The present invention devices a system for direct greyscale generation with a spatial light modulator, with a special view to the generation of ultra-precision patterns. Important aspects in the preferred embodiments, are uniformity of the image from pixel to pixel and independence of exact placement of a feature relative to the pixels of the SLM and stability when focus is changed, either with intention or inadvertently.

SUMMARY OF THE INVENTION

It is therefore an object of the present invention to provide an improved pattern generator for printing of precision patterns.

This object is achieved with an apparatus according to the appended claims, providing an analog modulation of the pixels in the SLM.

BRIEF DESCRIPTION OF THE DRAWINGS

FIG. 1 shows a printer in prior art. The SLM consists of micromirrors that deflect the light from the lens pupil.

FIG. 2 shows a number of pixel designs with the upper four pixels in an off state and the remaining five pixels turned on.

FIG. 4 shows a schematic comparison between an SLM with deflecting mirrors and an SLM with deforming mirrors.

DESCRIPTION OF THE INVENTION

Figure 2A:
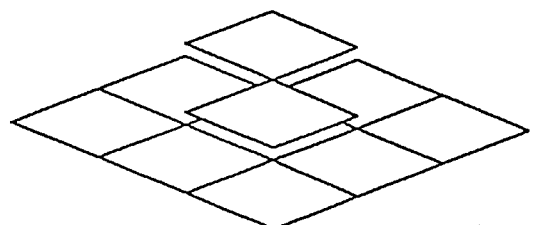
Figure 2B:
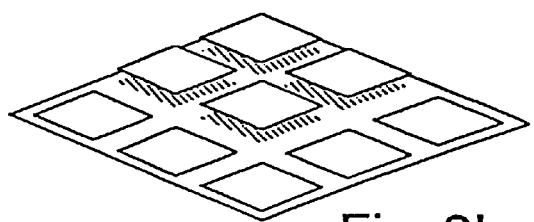

The basis for understanding the invention is the generic arrangement in FIG. 1 which shows a generic projection printer with an SLM. Spatial light modulators based on reflection come in two varieties, the deflection type (Nelson) and the phase type (Kück). The difference between them may in a particular case with micromirrors seem small, but the phase SLM extinguishes the beam in the specular direction by destructive interference, while a pixel in a deflection SLM deflects the specular beam geometrically to one side so that it misses the aperture of the imaging lens as shown in FIG. 1. For ultra-precise printing as performed in the current invention the phase-modulating system as described by Kück 1990 is superior to the deflecting type.

First, it has better contrast since all parts of the surface, also hinges and support posts, take part in the destructive interference and total extinction can be achieved. Second, a system that works by deflecting the light to the side is difficult to make symmetrical around the optical axis at intermediate deflection angles, creating a risk of feature instability when focus is changed. In the preferred embodiments the phase type is used, but if one accepts or designs around the asymmetry of the deflection type it could also be used. This is illustrated schematically in FIG. 4. In the first FIG. 4a, a non-deflected micromirror 401 is illuminated, and the reflected light is not directed towards the aperture 402, and, hence, the light does not reach the substrate 403. In FIG. 4b, on the other hand, the mirror is fully deflected, and all the reflected light are directed towards the aperture. In an intermediate position only part of the reflected light will reach the substrate, which is shown in FIG. 4c. However, in this case the light is not symmetrical around the optical axis for the lens 404, and there is an oblique incidence on the substrate. Hereby the distance between the lens and the substrate area becomes very critical, and small changes, such as the one being indicated by the dashed position for area, causes significant displacements of the features on the substrate. A way to solve this problem is indicated by the FIG. 4d-f. Here, a first exposure is made with a first deflection angle for the micromirror, and thereafter a second exposure, preferably with the same light dose, is made for a second deflection angle, being complementary to the first angle. Hereby, the combination of the first and second exposure is symmetrical around the optical axis for the lens. Another way to solve the problem is to use deforming mirror 401', such as is shown in FIG. 4g, whereby the reflected light is evenly distributed over aperture. This last figure could schematically represent two cases, a phase type SLM (described below) or a deflection SLM, where light is reflected from different parts of the mirror.

The phase SLM can be built either with micromachined mirrors, so called micromirrors, or with a continuous mirror surface on a supporting substrate that is possible to deform using an electronic signal. In Kück 1990 a viscoelastic layer controlled by an electrostatic field is used, but it is equally possible, especially for very short wavelengths where deformations of the order of a few nanometer are sufficient, to use a piezoelectric solid disk that is deformed by electric field or another electrically, magnetically or thermally controlled reflecting surface. For the remainder of this application an electrostatically controlled micromirror matrix (one- or two-dimensional) is assumed, although other arrangements as described above are possible, such as transmissive or reflecting SLMs relying on LCD crystals or electrooptical materials as their modulation mechanism, or micromechanical SLMs using piezoelectric or electrostrictive actuation.

The invention preferably uses a micromirror where the phase modulation is variable to obtain a variable amount of light reaching the pupil of the projection lens. FIG. 2 shows some multi-element mirrors. The tilts of the various parts of the mirrors are unimportant. In fact one element by itself would direct the light toward the lens while another would direct it outside of the pupil. The correct way to understand the function is to look at the complex amplitude reaching the center of the pupil from each infinitesimal area element of the mirror and integrate the amplitude over the mirror. With a suitable shape of the mirror it is possible to find a deformation where the complex amplitudes add up to almost zero, corresponding to no light reaching the pupil. This is the off-state of the micromirror, while a relaxed state where the mirror surface is flat and the complex amplitudes add in phase is the on-state. Between the on and off-states the amount of light in the specular direction is a continuous but non-linear function of the deformation.

The pattern to be written is normally a binary pattern, such as a photomask pattern in chrome on a glass substrate. In this context binary means that there are no intermediate areas: a certain point on the photomask surface is either dark (covered with chrome) or clear (no chrome). The pattern is exposed in photoresist by the projected image from the SLM and the photoresist is developed. Modern resists have high contrast, meaning that a small percentage change in exposure makes the difference between full removal of the resist in the developer and hardly any removal at all. Therefore the photoresist has an edge that is normally almost perpendicular to the substrate surface, even though the aerial image has a gradual transition between light and dark. The chrome etching does further increase the contrast, so that the resulting image is perfectly binary: either opaque or clear with no intermediate areas.

The input data is in a digital format describing the geometry of the pattern to be written on the surface. The input data is often given in a very small address unit, e.g. 1 nanometer, while setting pixels in the SLM to either on or off gives a much coarser pattern. If a pixel on the SLM is projected to a 0.1 µm pixel in the image, a line can only have a width that is an integer number of pixels (n*0.1 µm where n is an integer). An address grid of 0.1 µm was enough until recently, but the advent of so called optical proximity correction OPC makes a grid of 1-5 nanometers desirable. In OPC the size of features in the mask are modified slightly to compensate for predicted optical image errors when the mask is used. As an example, when a mask with four parallel lines 0.8 µm wide is printed in a modern 4× reduction stepper (a projection printer for semiconductor wafers) they will in a typical case print as lines 0.187, 0.200, 0.200, and 0.187 µm wide although they were intended to have the same width. This can be predicted by simulation of the image formation and the user of the mask may use OPC to compensate in the mask. therefore he wants the first and last line in the mask to be 4*0.213=0.852 µm instead of 0.800 µm. With an address grid of 0.1 µm he cannot make the correction, but with 5 nm address grid or finer such correction are possible.

Figure 5:
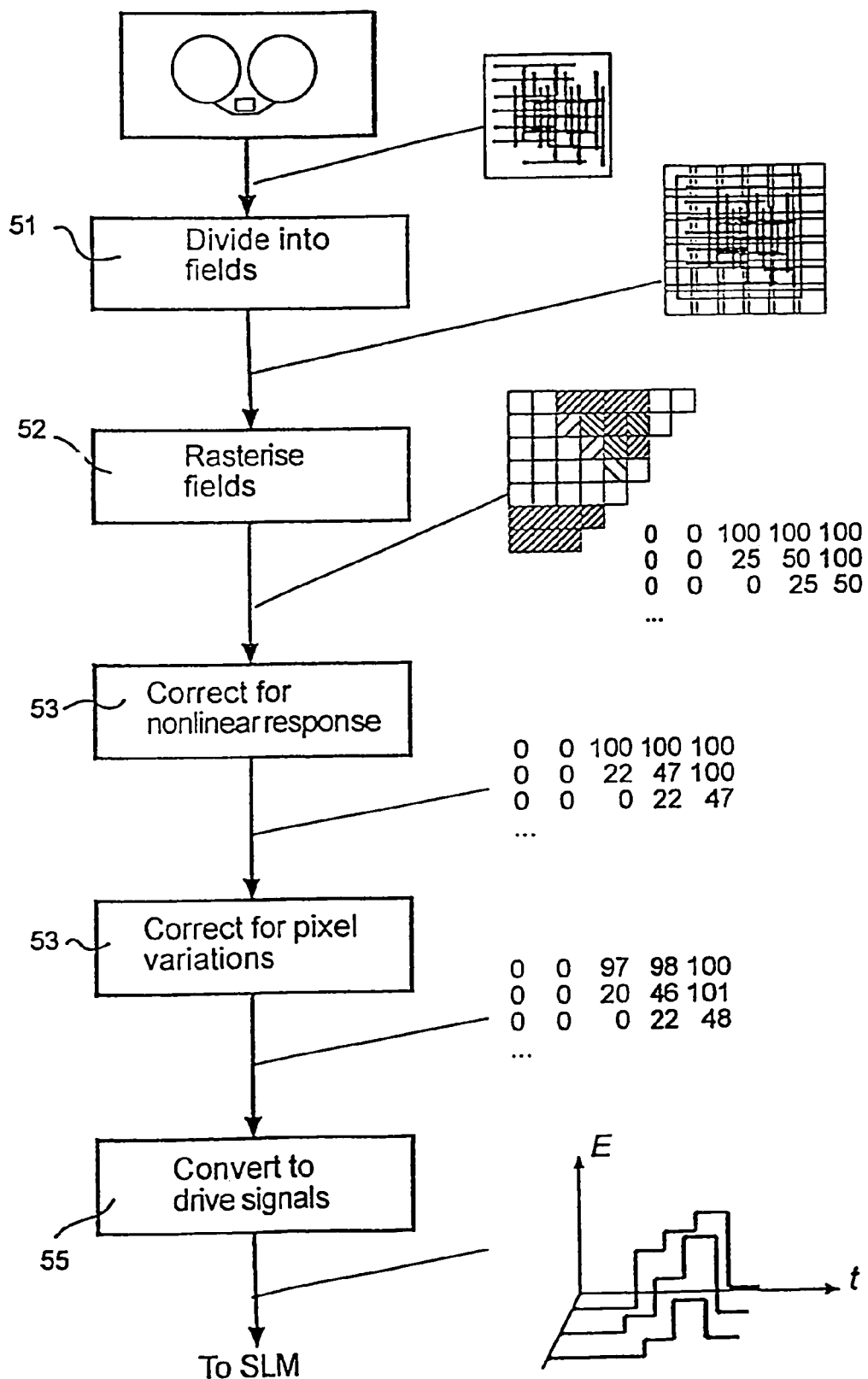
FIG. 5 shows a flow diagram of a method for translating and feeding data to the SLM.

In FIG. 5 the method for providing data for the SLM is shown in a flow diagram. The first step, S1, is to divide the pattern data for the pattern to be written into separate pattern fields. The pattern data is preferably received in digital form. Thereafter, in step S2, the fields are rasterised, and thereby assigned different exposure values. These values are then corrected for nonlinear response, step S3, and pixel-to-pixel variations, step S4. Finally, the pixel values are converted to drive signals and forwarded to the SLM.

The invention preferably uses intermediate values between the off-state and on-state to create a fine address grid, e.g. $\frac{1}{15}$, $\frac{1}{25}$, $\frac{1}{50}$, of the size of a pixel. A printed feature consists of pixels in the on state, but along the edge it has pixels set to intermediate values. This is done by driving the pixels with other voltages than the on and off voltages. Since there are several cascaded non-linear effects (the position of the edge versus exposure at the pixels at the boundary, the exposure vs. the deformation, and the deformation vs. the electric field) a non-linear transformation from the input data to the electric field is needed. Furthermore this transformation is calibrated empirically at regular time intervals.

Figure 3:
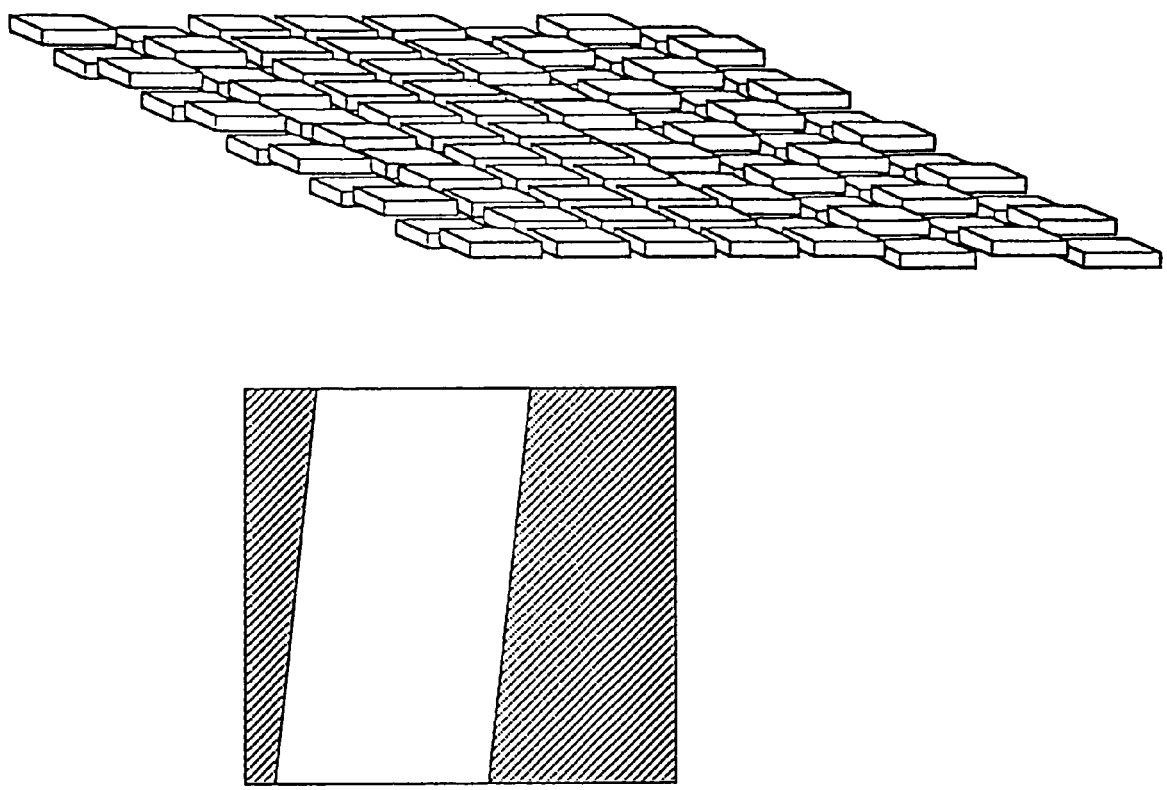
FIG. 3 shows an array of pixels moving up and down like pistons, thereby creating a phase difference. This is how an edge can be fine-positioned with a phase-type SLM.

FIG. 3 shows an array of pixels moving up and down like pistons, thereby creating a phase difference. The figure shows how the pixels are controlled to create the reflectivity in the inset. The bright areas have pixels with 0 phase, while dark areas are created by pixels with alternating +90 and −90 degree phase. The oblique boundaries between bright and dark areas are created by intermediate values of phase. This is how an edge can be fine-positioned with a phase-type SLM. However, other types of SLM with intermediate values could be used in the same manner. The imaging properties with the phase SLM driven into intermediate values are complex and it is far from obvious that the edge will be moved in FIG. 3. However, it has been shown by extensive theoretical calculations and experiments by the inventor, that the described effect is real.

To create a finer address grid the electronic processing system is adapted to create one type of pixel map inside pattern features, another type of pixel map outside features, and intermediate pixel maps at a boundary, as shown in FIG. 3, where the intermediate pixel map at a boundary is generated in dependence of the placement of the boundary in a grid finer than that of the pixels of the SLM projected on the workpiece. The SLM and the projection system creates one exposure level inside features, another exposure level between features, and an intermediate exposure level at the boundary. The intermediate exposure level is created using the capability of the SLM to modulate to multiple states.

The response from driving signals to actual placement of the boundary is characterized and corrected for. It is empirically measured and a calibrating function is computed and stored in the data processing and delivery system.

To further improve the address resolution the stage and the SLM are adapted to stitching exposure fields together along a direction not parallel to the coordinate system of the SLM, typically 45 degrees. In particular the continuous movement of the stage or optical system takes place in a direction not parallel to the SLM, but typically at 45 degrees from the coordinate system of the SLM. It is also possible to have an SLM with non-orthogonal axises, in which case it is advantageous to have no axis parallel to the direction of motion. Furthermore, to suppress line errors resulting from imperfections in the column and row drivers of the SLM of line error in the matrix itself it is effective to have the row and column lines at an angle to the direction of stitching, i.e. the vector between the centers of stitched fields.

Additional refinement of the address grid is created by the overlaying of at least two exposures with modified data such that the combined exposure has intermediate values not possible to obtain in a single exposure.

The Design of the Phase-type SLM

Figure 2C:
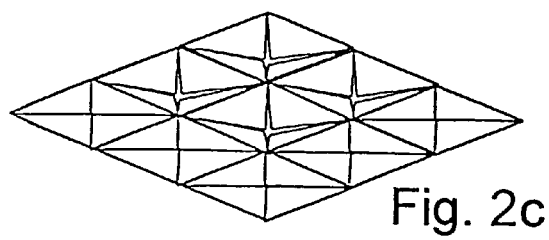
Figure 2D:
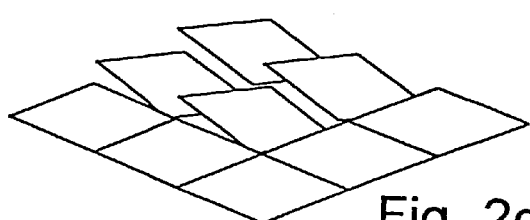
Figure 2E:
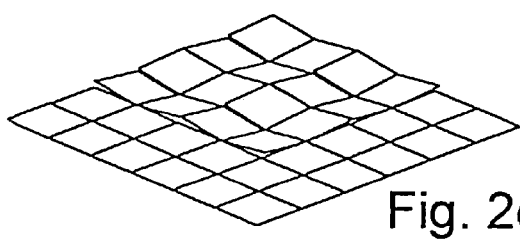
Figure 2F:
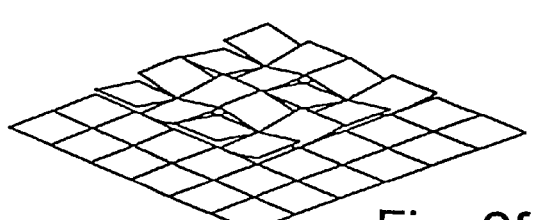
Figure 2G:
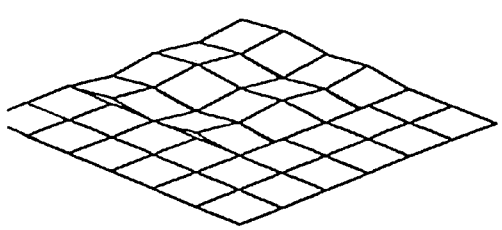
Figure 2H:
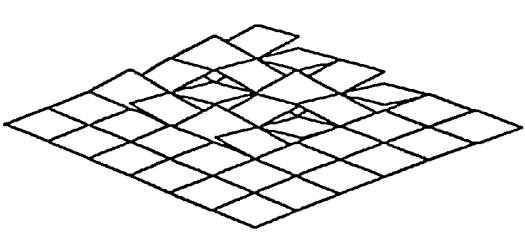
Figure 7:
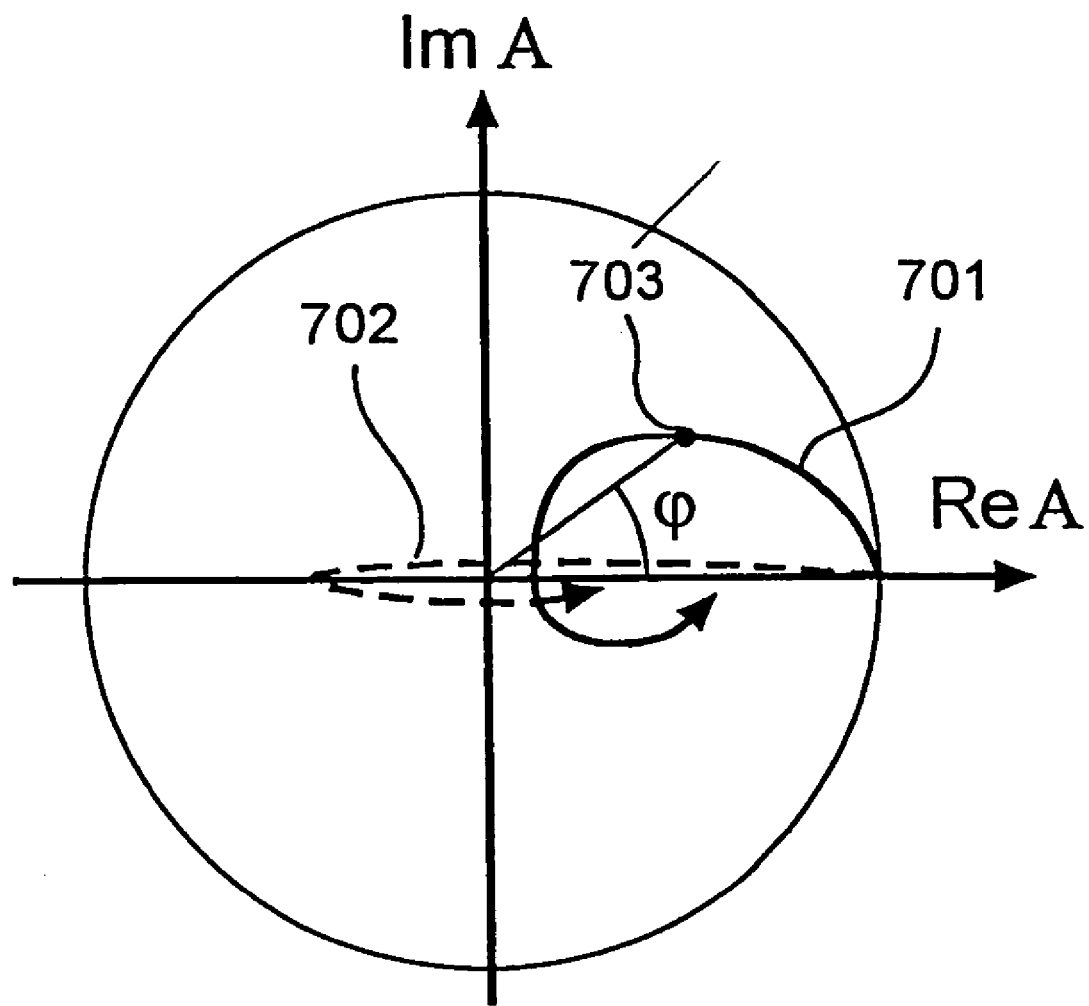
FIG. 7 shows schematically possible complex amplitudes for different types of SLM.

A cloverleaf mirror design, shown in FIG. 2c, as used in prior art is possible to drive to intermediate states between on and off states. However, when the integrated complex amplitude is plotted as a function of deflection, it is seen that it never goes to zero completely but circles around zero, therefore having a non-zero minimum reflectivity with a varying phase angle. This is shown schematically by the line 701 in FIG. 7, where 703 indicates a position for a certain deformation value, and □ being the associated phase angle. A thorough analysis of an image with some pixels set to intermediate states shows that the position of the edges in the final image are not stable through focus if the integrated phase angle of the edge pixels is not zero. This is the diffraction effect analogous to the specular one shown in FIG. 4. In a preferred embodiment of the invention a new type of pixels with pivoting elements is used. Examples of such elements are shown in FIG. 2e-h. When the elements pivots one end moves toward the light source and the other end away from it thereby keeping the average phase close to zero. This is shown schematically by the dashed line 702 in FIG. 7. Furthermore the cloverleaf design has a problem of built-in stress created during the fabrication. This stress tends to give a partial deformation without an applied electric field. The built-in deformation is not perfectly the same in every pixel since it depends on imperfections during the manufacturing. In the cloverleaf design this difference from pixel to pixel creates a first-order variation of reflectivity. With pixel cells built from pivoting elements the same effect occurs, but gives a second-order effect. Therefore the uniformity is better in the projected image.

The design of the modulating elements and the exposure method are adapted to creating, for differently placed and/or differently oriented edges in the pattern, a symmetry in the aperture stop of the projection system. Inherent assymetries between edges placed at different positions relative to the pixel grid can be reduced by overlaying at least two images with different placement of the pixel grid relative to the pattern.

For a deflection type of SLM the symmetry relates to the intensity distribution in the aperture stop. Best is to have modulating elements that deflect the light symmetrically relative to the center of the aperture stop, or else can overlayed exposures with complementary deflection be used to create symmetry. With modulating elements with steerable deflection it is possible to create a constant geometrical realtion between the deflection at a pixel at an edge and the edge, i.e. directing it in a direction perpendicular to the edge and toward the interior of the feature.

With a diffraction type SLM it is possible to create symmetry by overlaying exposures with opposite phase maps. Symmetry can be maintained if the complex amplitude is everywhere real on the SLM, and pixels can be designed with the integrated complex amplitude being essentiall real with values in the range −1 to 1. Many times it is sufficient with amplitudes in the range −0.5 to 1. This is the case with the square pivoting micromirror elements in FIG. 2e, f, g, h.

With access to a small negative amplitude to print in the background areas it is possible for enhance the resolution. In a more complex scheme it is possible to drive groups of adjacent pixels to combine in the image, and after being filtered by the imaging system, to give a desired real amplitude.

In order to preserve symmetry it is beneficial to have at least 2-fold symmetry and preferrably 4-fold. Symmetry can be created for pixels not having an inherent rotational symmetry by muple overlayed exposures. Furthermore, with a pixel design or exposure sequence giving a controlled real amplitude can be used for resolution enhancements. Dark lines can be given extra contrast if placed between areas with opposite phase and the edge of a feature can be improved by driving adjacent pixels inside the feature to higher positive amplitudes or adjacent pixels outside to negative ones.

Image Enhancements

There is a third advantage with a pivoting design: the cloverleaf does not reach full extinction, but a pivoting cell can more easily be given a geometry that gives full extinction, or even goes through zero and comes back to a small non-zero reflection, but with reversed phase. With better extinction there is greater freedom to print overlapping exposures, designing for a small negative value 702 gives better linearity close to extinction. Printing with a weak exposure, approximately 5%, in the dark areas, but with reversed phase can give an increased edge sharpness of 15-30% and the ability to print smaller features with a given lens. This is an analog to so called attenuating phase-shifting masks that are used in the semiconductor industry. A related method of increasing the edge acuity is to set the pixels that are inside a feature a lower value and those near the edge a higher value. This gives a new type of image enhancement not possible with current projection of patterns from masks or by the use of projectors following Nelson and Kück. The combination of a non-zero negative amplitude in the background and an increased exposure along the edges need not conflict with the creation of a fine address grid by driving edge pixels to intermediate values, since the effects are additive or at least computable. When the pixels are substantially smaller than the feature to be printed there exists a combination of pixel values that creates all effects simultaneously. To find them requires more computation than the generation of a fine address grid alone, but in some applications of the invention the ability to print smaller features can have a high value that pays for the extra effort.

In the case of a continuous mirror on a viscoelastic layer there is an inherent balancing of the average phase to zero. Simulations have shown that the driving to intermediate values for fine positioning of feature edges work also for the continuous mirror. The non-linearities are smaller than with micromirrors. But for the method to work well the minimum feature has to be larger than with micromirrors, i.e. have a larger number of addressed pixels per resolved feature element is needed. Consequences are a larger SLM device and that for given pattern the amount of data is larger. Therefore the micromirrors have been chosen in a first and second embodiment.

In the invention a pixel with rotation-symmetrical deformation (at least two-fold symmetry, in a preferred embodiment four-fold symmetry) is used for two reasons: to give a symmetrical illumination of the pupil of the projection lens and to make the image insensitive to rotations. The latter is important for printing a random logic pattern on a semiconductor wafer. If there is an x-y asymmetry the transistors laid-out along the x axis will have a different delay from those along the y axis and the circuit may malfunction or can only be used at a lower clock-speed. The two requirements of image invariance through focus and symmetry between x and y makes it very important to create and maintain symmetries in the optical system. Symmetry can be either inherent or it can be created by deliberate balancing of asymmetric properties, such as using multiple exposures with complementary asymmetric properties. However, since multiple exposures lead to reduced through-put inherent symmetrical layouts are strongly favored.

PREFERRED EMBODIMENTS

A first preferred embodiment is a deep-UV pattern generator for photomasks using an SLM of 2048×512 micromirrors. The light source is an KrF excimer laser with a pulsed output at 248 nanometers, pulse lengths of approximately 10 ns and a repetition rate of 500 Hz. The SLM has an aluminum surface that reflects more than 90% of the light. The SLM is illuminated by the laser through a beam-scrambling illuminator and the reflected light is directed to the projection lens and further to the photosensitive surface. The incident beam from the illuminator and the exiting beam to the lens are separated by a semitransparent beamsplitter mirror. Preferably the mirror is polarization-selective and the illuminator uses polarized light, the polarization direction of which is switched by a quarter-wave plate in front of the SLM. For x and y symmetry at high NA the image must be symmetrically polarized and a second quarter-wave plate between the beamsplitter and the projection lens creates a circularly polarized image. A simpler arrangement when the laser pulse energy allows it is to use a non-polarizing beamsplitter. The quarter-wave plate after the second pass through the beamsplitter is still advantageous, since it makes the design of the beam-splitting coating less sensitive. The simplest arrangement of all is to use an oblique incidence at the SLM so that the beams from the illuminator and to the projection lens are geometrically separated, as in FIG. 1.

The micromirror pixels are 20×20 μm and the projection lens has a reduction of 200×, making on pixel on the SLM correspond to 0.1 μm in the image. The lens is a monochromatic DUV lens with an NA of 0.8, giving a point spread function of 0.17 μm FWHM. The minimum lines that can be written with good quality are 0.25 μm.

The workpiece, e.g. a photomask, is moved with an interferometer-controlled stage under the lens and the interferometer logic signals to the laser to produce a flash. Since the flash is only 10 ns the movement of the stage is frozen during the exposure and an image of the SLM is printed, 204.8×51.2 μm large. 2 milliseconds later the stage has moved 51.2 μm, a new flash is shot and a new image of the SLM is printed edge to edge with the first one. Between the exposures the data input system has loaded a new image into the SLM, so that a larger pattern is composed of the stitched flashes. When a full column has been written the stage advances in the perpendicular direction and a new row is started. Any size of pattern can be written in way, although the first preferred embodiment typically writes patterns that are 125×125 mm To write this size of pattern takes 50 minutes plus the time for movement between consecutive columns.

Each pixel can be controlled to 25 levels (plus zero) thereby interpolating the pixel of 0.1 μm into 25 increments of 4 nanometers each. The data conversion takes the geometrical specification of the pattern and translates it to a map with pixels set to on, off or intermediate reflection. The datapath must supply the SLM with 2048*512*500 words of data per second, in practice 524 Mbytes of pixel data per second. In a preferred embodiment the writable area is maximally 230×230 mm, giving up to 230/0.0512=4500 flashes maximum in a column and the column is written in 4500/500=9 seconds. The amount of pixel data needed in one column is 9×524=4800 Mb. To reduce the amount of transferred and buffered data a compressed format is used, similar to the one in Sandström at al. 90, but with the difference that a pixel map is compressed instead of segments with a length and a value. A viable alternative is to create a pixel map immediately and use commercially available hardware processors for compression and decompression to reduce the amount of data to be transferred and buffered.

Even with compression the amount of data in a full mask makes it highly impractical to store pre-fractured data on disk, but the pixel data has to be produced when it is used. An array of processors rasterise the image in parallel into the compressed format and transfer the compressed data to an expander circuit feeding the SLM with pixel data. In the preferred embodiment the processors rasterise different parts of the image and buffer the result before transmitting them to the input buffer of the expander circuit.

A Second Preferred Embodiment

In a second preferred embodiment the laser is an ArF excimer laser with 193 nm wavelength and 500 Hz pulse frequency. The SLM has 3072×1024 pixels of 20*20 μm and the lens has a reduction of 333× giving a projected pixel of 0.06 μm. There are 60 intermediate values and the address grid is 1 nanometer. The point spread function is 0.13 μm and the minimum line 0.2 μm. The data flow is 1572 Mbytes/s and the data in one column 230 mm long is 11.8 Gb.

A third preferred embodiment is identical with the second one except that the matrix of pixels is rotated 45 degrees and the pixel grid is 84 μm, giving a projected pixel spacing along x and y of 0.06 μm. The laser is an ArF excimer laser and the lens the reduction of 240. Because of the rotated matrix the density of pixels in the matrix is less and the data volume is half of the previous embodiment but with the same address resolution.

Laser Flash to Flash Variations

The excimer laser has two unwanted properties, flash-to-flash energy variations of 5% and flash-to-flash time jitter of 100 ns. In the preferred embodiments both are compensated in the same way. A first exposure is made of the entire pattern with 90% power. The actual flash energy and time position for each flash is recorded. A second exposure is made with nominally 10% exposure and with the analog modulation used to make the second exposure 5-15% depending on the actual value of the first one. Likewise a deliberate time offset in the second exposure can compensate for the time jitter of the first one. The second exposure can fully compensate the errors in the first, but will itself give new errors of the same type. Since it is only on average 10% of the total exposure both errors are effectively reduced by a factor of ten. In practice the laser has a time uncertainty that is much larger than 100 ns, since the light pulse comes after a delay from the trigger pulse and this delay varies by a couple of microseconds from one time to another. Within a short time span the delay is more stable. Therefore the delay is measured continuously and the last delay values, suitably filtered, are used to predict the next pulse delay and to position the trigger pulse.

It is possible to make corrections for stage imperfections in the same way, namely if the stage errors are recorded and the stage is driven with a compensating movement in the second exposure. Any placement errors that can be measured can in principle be corrected in this way, partially or fully. It is necessary to have a fast servo to drive the stage to the computed points during the second exposure. In prior art it is known to mount the SLM itself on a stage with small stroke and short response time and use it for fine positioning of the image. Another equally useful scheme is to use a mirror with piezoelectric control in the optical system between the SLM and the image surface, the choice between the two is made from practical considerations. It is also possible to add a position offset to the data in an exposure field, and thereby move the image laterally.

The second exposure is preferably done with an attenuating filter between the laser and the SLM so that the full dynamic range of the SLM can be used within the range 0-15% of the nominal exposure. With 25 intermediate levels it is possible to adjust the exposure in steps of 15%*1/25-0.6%.

The response varies slightly from pixel to pixel due to manufacturing imperfections and, potentially, also from ageing. The result is an unwanted inhomogeneity in the image. Where image requirements are very high it may be necessary to correct every pixel by multiplication with the pixels inverse responsivity which is stored in a lookup memory. Even better is the application of a polynomial with two, three or more terms for each pixel. This can be done in hardware in the logic that drives the SLM.

In a more complex preferred embodiment several corrections are combined into the second corrective exposure: the flash to flash variation, flash time jitter, and also the known differences in the response between the pixels. As long as the corrections are small, i.e. a few percent in each they will add approximately linearly, therefore the corrections can be simply added before they are applied to the SLM. The sum is multiplied with the value desired exposure dose in that pixel.

Alternative Illumination Sources

The excimer laser has a limited pulse repetition frequency (prf) of 500-1000 Hz depending on the wavelength and type of the laser. This gives large fields with stitching edges in both x and y. In two other preferred embodiments the SLM is illuminated with a pulsed laser with much higher prf, e.g. a Q-switched upconverted solid state laser, and with a continuous laser source scanned over the surface of the SLM, so that one part of the SLM is reloaded with new data while another part is printed. In both cases the coherence properties of the lasers are different from the excimer laser and a more extensive beam-scrambling and coherence control is needed, e.g. multiple parallel light paths with different pathlengths. In some implementations of the invention the light output from a flash lamp is sufficient and can be used as the light source. Advantages are low cost and good coherence properties.

In the preferred embodiment with scanning illumination two issues are resolved: the pulse to pulse variation in time and energy, since the scanning is done under full control preferably using an electrooptic scanner such as acoustooptic or electrooptic, and many continuous laser have less power fluctuation that pulsed lasers. Furthermore the use of continuous lasers gives a different selection of wavelengths and continuous lasers are less dangerous to the eye than pulsed lasers. Most important, however, is the possibility of reaching much higher data rates with a matrix with only a few lines since the scanning is non-critical and can be done with 100 kHz repetition rate or higher. Scanning the illumination beam is also a way of creating a very uniform illumination, which is otherwise difficult.

In some embodiments it is possible, and feasible, to use a flash lamp as the illumination source.

EUV

Light sources for EUV are based on radiation from a particle accelerator, a magnetic plasma pinch machine or the heating of a small drop of matter to extreme temperatures with a high-power laser pulse. In either case the radiation is pulsed. The EUV radiation propagates only in vacuum and can only be focused by reflective optics. A typical pattern generator using an SLM has a small exposure field a modest requirement of optical power. The design of the optical system is therefore relaxed compared to that of an EUV stepper, making it possible to use more mirrors and go to higher NA than in a stepper. It is anticipated that a high-NA lens will have a ring-shaped exposure field and it is fully possible to adapt the shape of the SLM to such a field. With a wavelength of 13 nm and an NA of 0.25 it is possible to expose lines that are only 25 nm wide, and, using image enhancement as described below, even below 20 nm. No other known writing technology can match this resolution and a the same time the writing speed that is made possible by the parallel character of an SLM.

Edge Overlap

Since a two-dimensional field is printed for each flash and the fields are stitched together edge to edge to edge the stitching is very critical. A displacement of only a few nanometers of one field will create pattern errors along that edge that are visible and potentially detrimental to the function of an electronic circuit produced from the mask. An effective way of reducing the unwanted stitching effects is to print the same pattern in several passes but with a displacement of the stitching boundaries between the passes. If the pattern is printed four times the stitching error will occur in four positions, but with only a fourth of the magnitude. In a preferred embodiment of the current invention the ability to create intermediate exposures is used together with an overlap band between the fields. The values are computed during the rasterisation, although it could also be done during the expansion of the compressed data. Edge overlap reduces the stitching errors with much less throughput penalty than multipass printing.

Modified Illumination

Figure 8A:
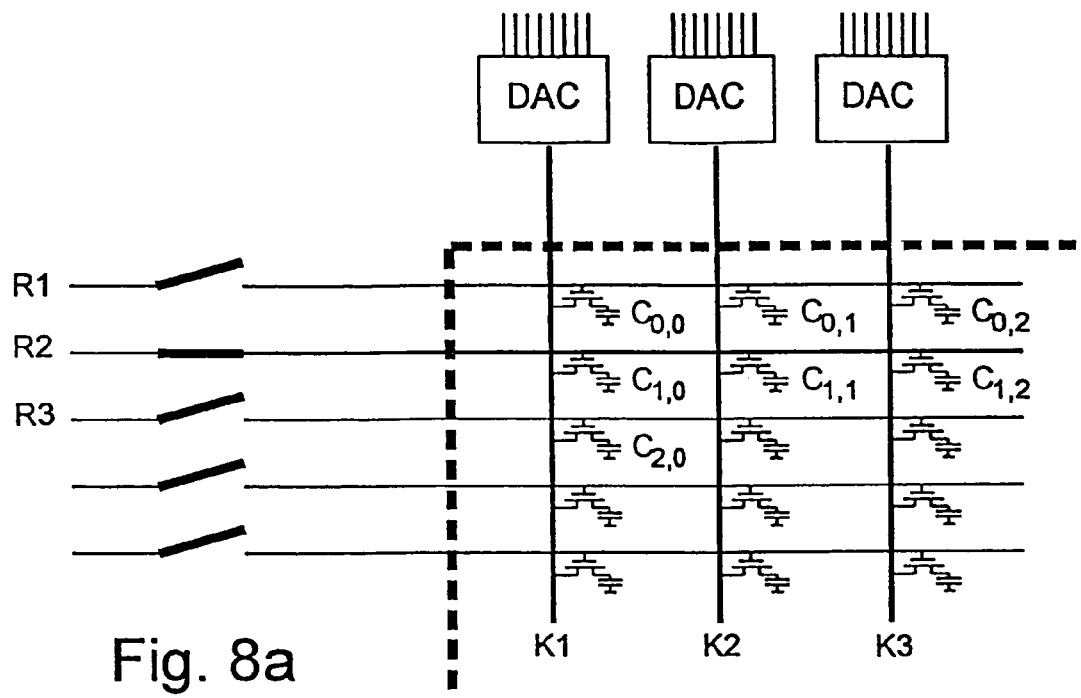
FIG. 8 shows schematically different types of controlling of the SLM mirrors.
Figure 8B:
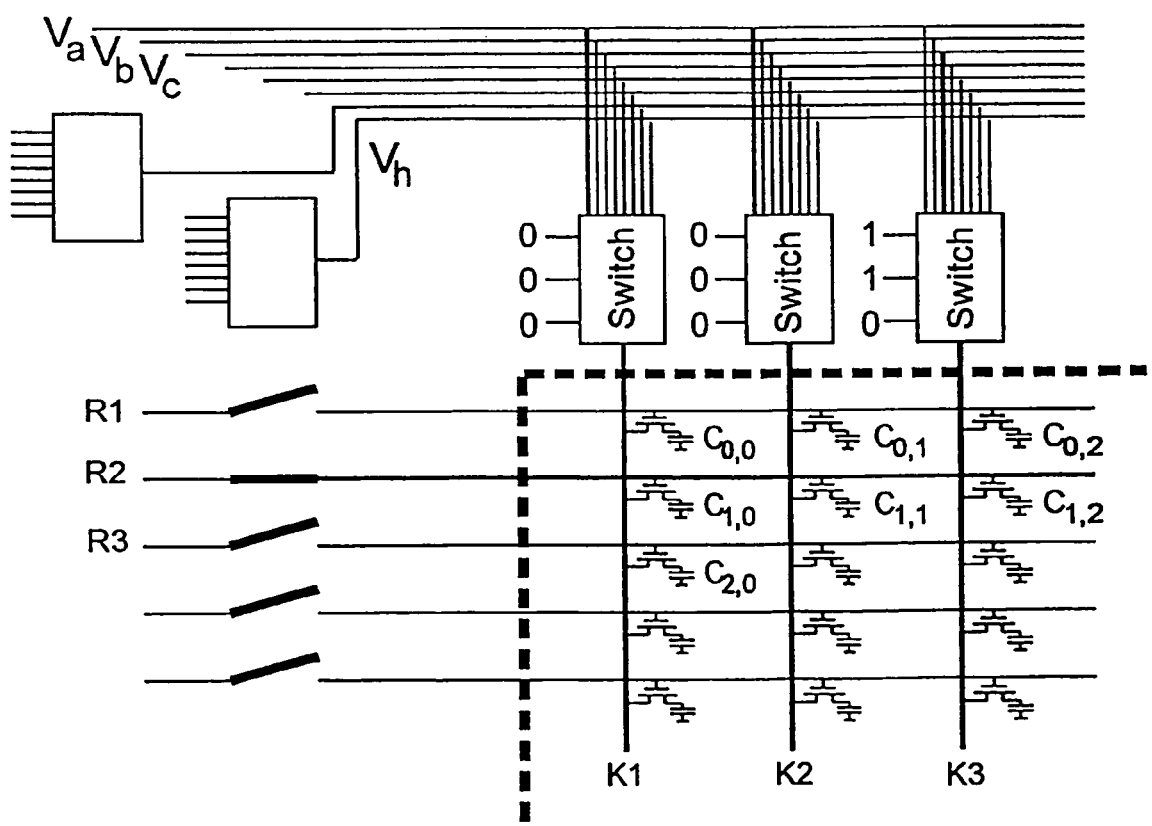

In the first preferred embodiment the illumination of the SLM is done by an excimer laser and a light scrambler such as a fly-eye lens array to create an illumination that resembles that from a circular self-luminous surface in the pupil plane of the illuminator. In order to increase the resolution when printing with a specific projection system it is possible to use a modified illumination. In the most simple cases pupil filters are introduced in the pupil plane of the illuminator, e.g. with a quadrupole-shaped or annular transmission area. In a more complex case the same field is printed several times. Several parameters can be made to vary between the exposures, such as focus in the image plane, illumination pattern, data applied to the SLM and pupil filter in the pupil plane of the projection optics. In particular the synchronized variation of the illumination and a pupil filter can give an increased resolution, most notably if the pupil has and a sector-shaped transmitting area and the illumination is aligned so that the non-diffracted light intercepts an absorbing patch near the apex of the sector Linearization of the Response For linearization of the transfer function from data to edge placement here are essentially three ways to go:

taking the non-linearity into account in the data conversion unit and generating an 8 bit (example) pixel values in the data conversion unit and use DACs with the same resolution to drive the SLM. This is shown schematically in FIG. 8a, where R are relay signals and C are capacitors being provided on each matrix element on the SLM. The SLM is indicated by the dashed line.

to generate digital values with fewer values, e.g. 5 bits or up to 32 values, and translate them to an 8 bit value in a look-up table (LUT) and then feed the 8 bit values to the DACs.

to use a 5 bit value and semiconductor switches to select a DC voltage that is generated by one or several high-resolution DACs. This is shown schematically in FIG. 8b.

In either case it is possible to measure an empirical calibration function such that the response on the plate is laniaries, when said function being applied at respectively the data conversion unit, the LUT or in the DC voltages.

Which linearization scheme to use depends on the data rate, the precision requirements and also on the available circuit technology that may change over time. At the present time the data conversion unit is a bottleneck and therefore it is not a preferred solution to line arise in the data conversion unit, neither to generate 8-bit pixel values. High-speed DACs are expensive and power-hungry and the most appropriate solution is to generate DC voltages and use switches. It is then possible to use even higher resolution than 8 bits.

Description of a Preferred Pattern Generator

Figure 6:
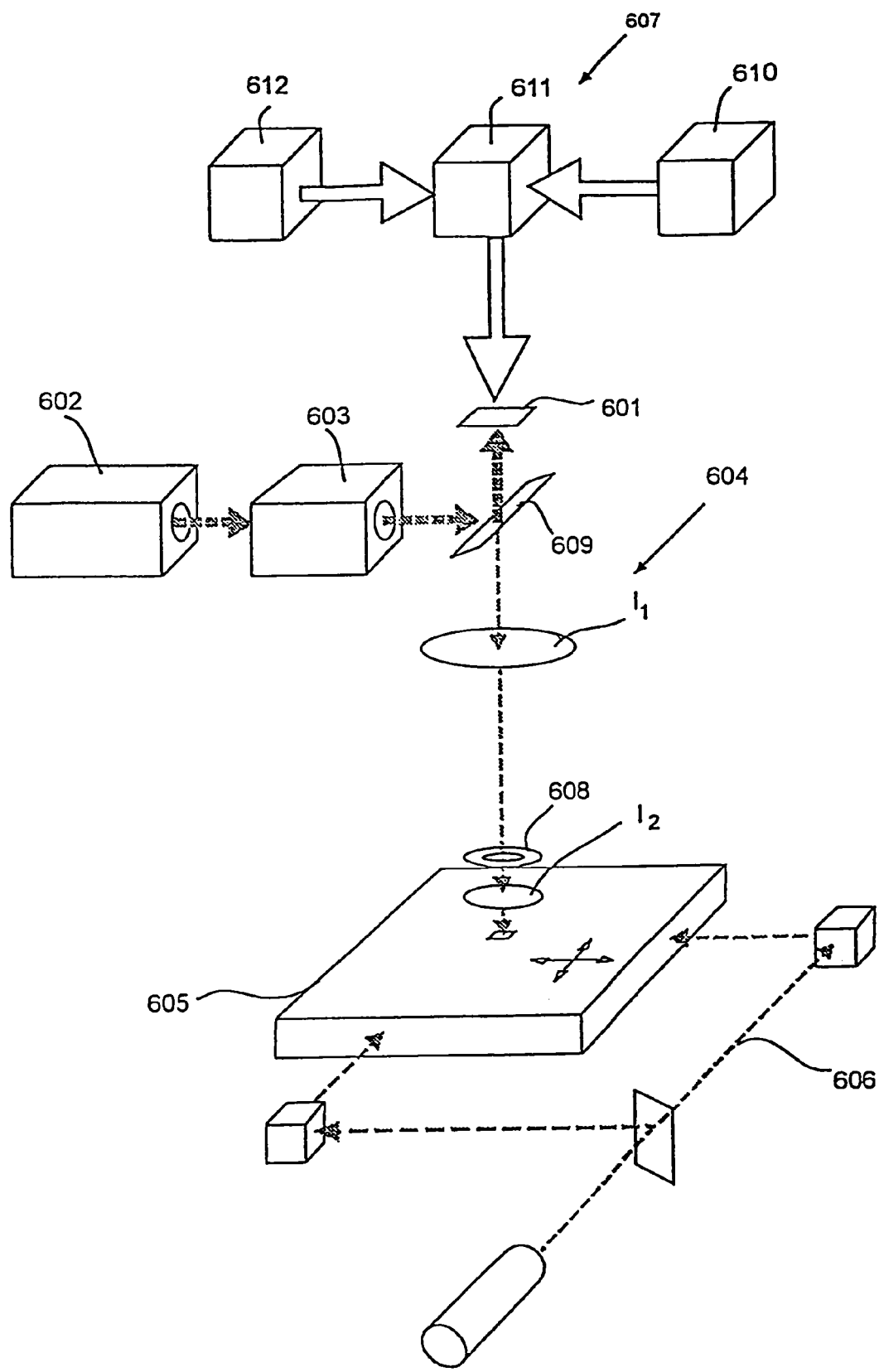
FIG. 6 shows a preferred embodiment of a pattern generator according to the invention.

Referring to FIG. 6, a pattern generator comprises an SLM 601 with individual and multi-value pixel addressing, an illumination source 602, an illumination beam scrambling device 603, an imaging optical system 604, a fine positioning substrate stage 605 with an interferometer position control system 606 and a hardware and software data handling system 607 for the SLM. For proper functionality and ease of operation it also contains a surrounding climate chamber with temperature control, a substrate loading system, software for timing of stage movement and exposure laser triggering to achieve optimum pattern placement accuracy and a software user interface.

The illumination in the pattern generator is done with a KrF excimer laser giving a 10-20 nanoseconds long light flash in the UV region at 248 nanometer wavelength with a bandwidth corresponding to the natural linewidth of an excimer laser. In order to avoid pattern distortion on the substrate, the light from the excimer laser is uniformly distributed over the SLM surface and the light has a short enough coherence length not to produce laser speckle on the substrate. A beam scrambler is used to achieve these two aims. It divides the beam from the excimer laser in several beam paths with different path length and then adds them together in order to reduce the spatial coherence length. The beam scrambler also has a beam homogenizer consisting of a lens system containing a set of fly-eye lenses that distributes the light from each point in the laser beam from the excimer laser uniformly over the SLM surface giving a "top-hat" light distribution. This beam scrambling, homogenizing and reduction of coherence is advantageous in all SLM printers. Depending on the actual circumstances implementations using beam-splitters and combiners, diffractive elements, optical fibers, kaleidoscopes, lenslet arrays, prisms or prism arrays or integrating spheres can be used, as well as other similar devices in combinations which split and combines the beams to create a multitude of mutually incoherent light fields impinging on the SLM.

The light from the SLM is relayed and imaged down to the substrate on the substrate stage. This is done using a Schlieren optical system described by Kück. A lens $l_1$ with the focal width $f_1$ is placed at the distance $f_1$ from the SLM. Another lens $l_2$ with the focal length $f_2$ is placed at the distance $2 \times f_1 + f_2$ from the SLM. The substrate is then at a distance $2 \times f_1 + 2 \times f_2$ from the SLM. At the distance $2 \times f_1$ from the SLM there is an aperture 608 which size determines the numerical aperture (NA) of the system and thereby the minimum pattern feature size that can be written on the substrate. In order to correct for imperfections in the optical system and the substrate flatness there is also a focal system that dynamically positions the lens $l_2$ in the z direction with a position span of 50 micrometers to achieve optimal focal properties. The lens system is also wavelength corrected for the illuminating wavelength of 248 nanometers and has a bandwidth tolerance of the illuminating light of at least ±1 nanometer. The illuminating light is reflected into the imaging optical system using a beamsplitter 609 that is positioned immediately above the lens $l_1$. For a demagnification factor of 250 and an NA of 0.62 it is possible to expose pattern features with a size down to 0.2 micrometers with a good pattern quality. With 32 levels from each SLM-pixel the minimum gridsize is 2 nanometers.

The pattern generator has a fine positioning substrate stage with an interferometer position control system. It consists of a moveable air bearing xy table 605 made of zerodur for minimum thermal expansion. A servo system with an interferometer position feedback measuring system 606 controls the stage positioning in each direction. In one direction, y, the servo system keeps the stage in fixed position and in the other direction, x, the stage moves with continuous speed. The interferometer position measuring system is used in the x-direction to trigger the exposure laser flashes to give uniform position between each image of the SLM on the substrate. When a full row of SLM images are exposed on the substrate the stage moves back to the original position in the x direction and moves one SLM image increment in the y direction to expose another row of SLM images on the substrate. This procedure is repeated until the entire substrate is exposed.

The SLM images overlaps with a number of pixels in both the x and y direction and the exposure data pattern is locally modified in the overlap pixels to compensate for the increased number of exposures that result in such overlap areas.

Variations in pulse to pulse intensity from the excimer laser is compensated by using two-pass exposure of the pattern where the first pass is done using a nominal 90% intensity of the correct intensity. In the first pass, the actual intensity in each laser flash is measured and stored. In the second pass, the correct intensity for each SLM image exposure is then used based on the measured intensity values from the first pass. In this way it is possible to reduce the influence from pulse to pulse intensity variations from the excimer laser by one order of magnitude.

The functionality of the SLM is described extensively elsewhere in this text. It has 2048×256 pixels with pixel size of 16 micrometers and it is possible to address all pixels within 1 millisecond. The SLM is rigidly mounted in a fine stage. This fine stage is moveable 100 microns in the x and y directions with accuracy better than 100 nanometers between each flash exposure. The fine positioning of the SLM is used to correct for position inaccuracy of the substrate positioning stage to further reduce pattern-stitching errors. In addition to the x-y positioning, there is also a rotational possibility of the SLM stage in order to expose a pattern on a substrate with an angle other than the one specified by the substrate stage coordinate system. The purpose for such rotation is to create the possibility of incorporating substrate alignment feasibility for substrates with an already existing pattern where additional features shall be added. It is possible to measure the exact position of the substrate on the stage after loading it using an off axis optical channel and/or a CCD camera looking through the lens to determine the system coordinates for a number of alignment marks existing on the substrate. During exposure, the stage position is then corrected in the x- and y-directions based on the measured positions of the alignment marks. Rotational alignment is achieved by using the stage servo system to follow the rotated coordinate system and also rotating the SLM fine stage as described. The possibility of rotating the SLM makes it also possible to write in a distorted coordinate system, such as to compensate for subsequent warpage of the pattern.

An arbitrary data pattern of an arbitrary format is transformed into a compressed rasterized pixel map with 32 (5 bit) gray levels per pixel in a pattern rasterizer 610. Since the grayscale steps of an exposed pixel is not linear in response to the voltage applied to the pixel electrode, the input data is linearized in a pixel linearizer 611 so that the 32 gray levels correspond to a uniform increase in exposure dose for each successive level. This is done using 8-bit digital to analog converters (DAC) 612 where each gray level from the pixel map selects a voltage from the DAC's according to a previously empirically calibrated linearization function. An additional offset in the choice of analog level from the DAC's is made using a lookup table where each value corresponds to an SLM pixel and each such value corrects for anomalies of the corresponding pixel. The calibration values in the lookup table are generated using an empirical calibration procedure where a series of test patterns are sent to the SLM and the resulting exposed patterns are measured and used for individual pixel correction. This means that each gray level in the pixel map selects an analog voltage generating a pixel deformation for every corresponding SLM pixel to give the correct exposure dose.

The invention claimed is:

1. An apparatus for creating a pattern on a workpiece sensitive to light radiation, the apparatus comprising:
    a light source for emitting light in the wavelength range from EUV to IR;
    a spatial light modulator (SLM) having a multitude of modulating elements and adapted to be illuminated by said light source;
    a projection system for projecting an image of the modulator on the workpiece;
    a precision mechanical system for scanning the workpiece by providing a continuous relative motion between the projection system and the workpiece, thereby causing the image of the modulator to move continuously on the workpiece;
    an electronic data processing and delivery system receiving a digital description of the pattern to be written, converting said digital description of the pattern to modulator signals and feeding said signals to the modulator, and
    an electronic control system for controlling the position of the workpiece and the feeding of the signals to the modulator so that said pattern is created on the workpiece; wherein
        said projection system creates the pattern on the workpiece during said scanning of the workpiece; and
        said electronic control system is further arranged to control a trigger signal to the light source for emitting the light so that a trigger signal timing is varied to at least partially correct for pattern placement errors.

2. The apparatus of claim 1, wherein the light source is a laser.

3. The apparatus of claim 1, wherein the pattern is formed in photoresist, photopolymer or photographic emulsion.

4. A method for creating a pattern on a workpiece sensitive to light radiation, the method comprising:
    emitting light in the wavelength range from EUV to IR,
    modulating the emitted light with a spatial light modulator (SLM) having a multitude of modulating elements,
    scanning the workpiece by providing a continuous relative motion between a projection system and the workpiece, thereby causing the image of the modulator to move continuously on the workpiece;
    projecting, using said projecting system, an image of the modulator on the workpiece during said continuous scanning of the workpiece;
    controlling the emitted radiation, the modulator and the positioning of the workpiece to create said pattern on said workpiece; wherein
        said controlling step involves controlling a trigger signal to a light source for emitting the light so that a trigger signal timing is varied to at least partly correct for pattern placement errors.

5. An apparatus for creating a pattern on a workpiece sensitive to light radiation, the apparatus comprising:
- a light source for emitting light in the wavelength range from EUV to IR,
- a spatial light modulator (SLM) having a multitude of modulating elements adapted to be illuminated by said light source;
- a projection system for projecting an image of the modulator on the workpiece;
- a precision mechanical system for scanning the workpiece by providing a continuous relative motion between the projection system and the workpiece, thereby causing the image of the modulator to move continuously on the workpiece;
- an electronic control system for controlling the position of the pattern created on the workpiece, the modulating elements of the modulator and the intensity of the radiation in accordance with a pattern to be created; wherein said projection system creates the pattern on the workpiece during said scanning of the workpiece, and said electronic control system is further arranged to control a trigger signal to the light source for emitting the light so that a trigger signal timing is varied to at least partially correct for pattern placement errors.

6. The apparatus of claim 5, wherein the light source is a laser.

7. The apparatus of claim 5, wherein the pattern is formed in photoresist, photopolymer or photographic emulsion.

* * * * *

UNITED STATES PATENT AND TRADEMARK OFFICE
CERTIFICATE OF CORRECTION

| | |
|---|---|
| PATENT NO. | : 7,365,901 B2 |
| APPLICATION NO. | : 11/314413 |
| DATED | : April 29, 2008 |
| INVENTOR(S) | : Torbjorn Sandstrom |

Page 1 of 1

It is certified that error appears in the above-identified patent and that said Letters Patent is hereby corrected as shown below:

ON THE TITLE PAGE PLEASE ADD THE FOLLOWING:

Item (30) Foreign Application Priority Data: March 2, 1998 (SE) ..... 9800665-3

Item (63) Related U.S. Application Data: Continuation of application No. 10/776,192, filed on Feb. 12, 2004, now Pat. No. 7,009,753, which is a continuation of application No. 09/623,195, filed on Aug. 29, 2000, now Pat. No. 6,747,783, which is a 371 of PCT/SE99/00310 filed March 2, 1999.

Signed and Sealed this

Twenty-second Day of July, 2008

JON W. DUDAS
*Director of the United States Patent and Trademark Office*